(12) United States Patent
Mueller et al.

(10) Patent No.: US 11,951,866 B2
(45) Date of Patent: Apr. 9, 2024

(54) METHOD AND DEVICE FOR DETERMINING AN OPERATING TEMPERATURE, OPERATING METHOD FOR A BATTERY CELL, CONTROL UNIT FOR A BATTERY CELL, AND WORKING DEVICE

(71) Applicant: Bayerische Motoren Werke Aktiengesellschaft, Munich (DE)

(72) Inventors: Jennifer Mueller, Munich (DE); Jan Philipp Schmidt, Munich (DE); Hermann Zehentner, Hohenpolding (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 1044 days.

(21) Appl. No.: 16/680,069

(22) Filed: Nov. 11, 2019

(65) Prior Publication Data

US 2020/0079239 A1 Mar. 12, 2020

Related U.S. Application Data

(63) Continuation of application No. PCT/EP2018/063585, filed on May 24, 2018.

(30) Foreign Application Priority Data

May 31, 2017 (DE) ...................... 10 2017 209 182.7

(51) Int. Cl.
*B60L 58/10* (2019.01)
*B60L 50/60* (2019.01)
(Continued)

(52) U.S. Cl.
CPC ............... *B60L 58/10* (2019.02); *B60L 50/66* (2019.02); *G01R 31/389* (2019.01);
(Continued)

(58) Field of Classification Search
CPC ............................. B60L 58/10; G01R 31/389
(Continued)

(56) References Cited

U.S. PATENT DOCUMENTS 8,994,340 B2 * 3/2015 Matthe ...................... H02J 7/00
320/152
10,162,401 B1 * 12/2018 Brys .................... G01R 31/389
(Continued)

FOREIGN PATENT DOCUMENTS

| DE | 10 2013 103 921 A1 | 11/2013 |
| DE | 10 2013 000 220 B3 | 4/2014 |
| WO | WO 2006/048625 A1 | 5/2006 |

OTHER PUBLICATIONS

PCT/EP2018/063585, International Search Report dated Aug. 2, 2018 (Two (2) Pages).
(Continued)

*Primary Examiner* — Yalkew Fantu
(74) *Attorney, Agent, or Firm* — Crowell & Moring LLP

(57) ABSTRACT

A method for determining an operating temperature of a battery cell in which (i) a value of a measure variable for determining an external temperature of the battery cell is detected, (ii) an internal temperature of the battery cell is determined by detecting an electrical impedance of the battery cell, and (iii) a value of the operating temperature of the battery cell is determined from the external and/or the internal temperature. The internal temperature of the battery cell in a first operating state of the battery cell is determined more frequently when the value of the determined external temperature, the internal temperature and/or the operating temperature lies within a predefined first safe range, and is determined less frequently when the value of the determined external temperature, the internal temperature and/or the operating temperature lies outside the predefined first safe range.

17 Claims, 3 Drawing Sheets

(51) Int. Cl.
*G01R 31/389* (2019.01)
*H01M 10/48* (2006.01)

(52) U.S. Cl.
CPC ....... *H01M 10/486* (2013.01); *B60L 2240/36* (2013.01); *H01M 2220/20* (2013.01)

(58) Field of Classification Search
USPC ........................................................ 324/441
See application file for complete search history.

(56) References Cited

U.S. PATENT DOCUMENTS

| | | | | |
|---|---|---|---|---|
| 2008/0120050 | A1* | 5/2008 | Iwane | G01R 31/392 |
| | | | | 320/136 |
| 2012/0099618 | A1* | 4/2012 | Nishi | G01R 31/3842 |
| | | | | 374/152 |
| 2017/0085107 | A1* | 3/2017 | Rastegar | H01M 10/443 |
| 2017/0358933 | A1* | 12/2017 | Becker | H01M 10/633 |
| 2019/0207406 | A1* | 7/2019 | Matthey | H02J 7/00309 |

OTHER PUBLICATIONS

German Search Report issued in German counterpart application No. 10 2017 209 182.7 dated Mar. 22, 2018, with Statement of Relevancy (Seven (7) pages).

* cited by examiner

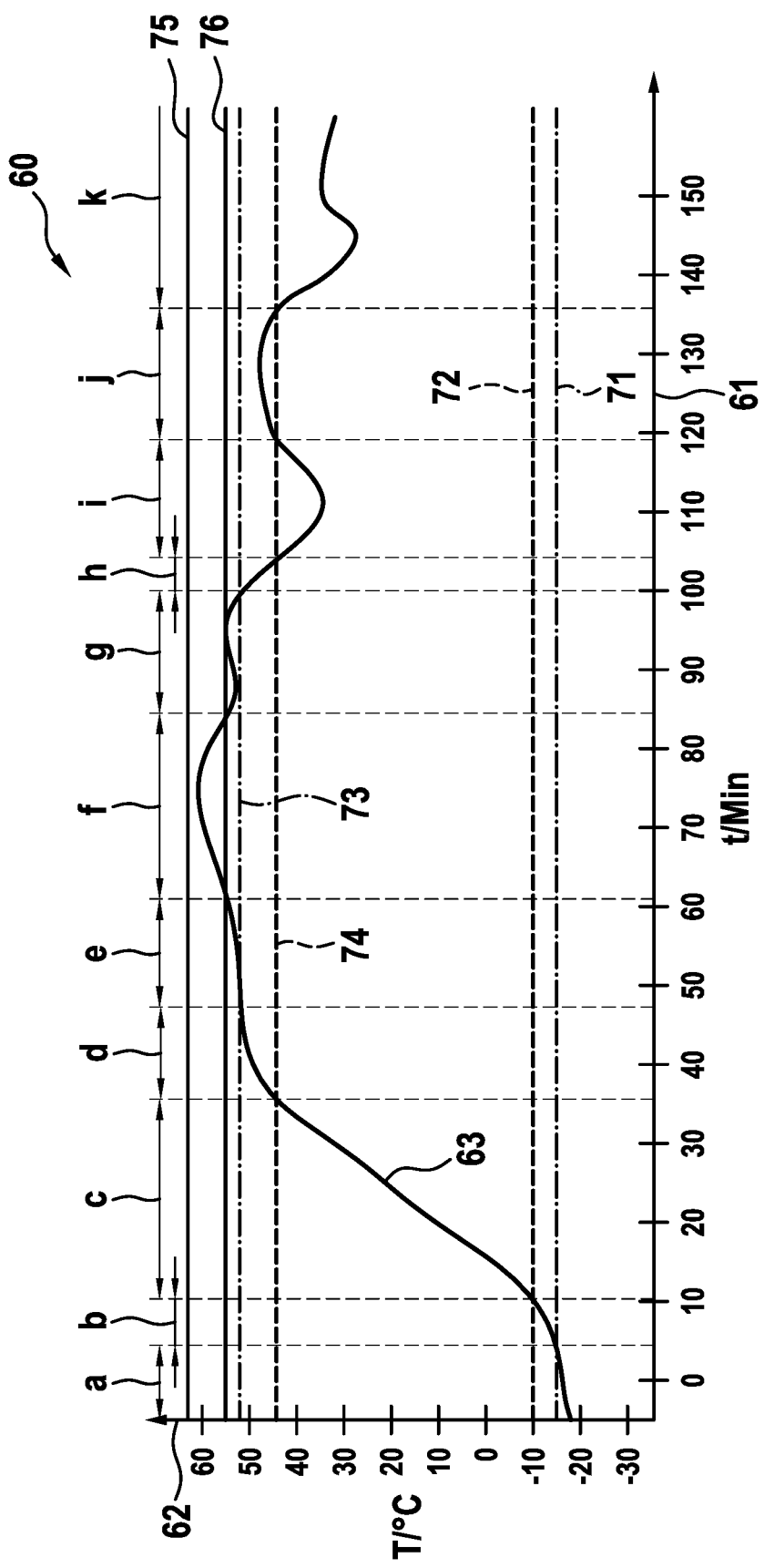

METHOD AND DEVICE FOR DETERMINING AN OPERATING TEMPERATURE, OPERATING METHOD FOR A BATTERY CELL, CONTROL UNIT FOR A BATTERY CELL, AND WORKING DEVICE

CROSS REFERENCE TO RELATED APPLICATIONS

This application is a continuation of PCT International Application No. PCT/EP2018/063585, filed May 24, 2018, which claims priority under 35 U.S.C. § 119 from German Patent Application No. 10 2017 209 182.7, filed May 31, 2017, the entire disclosures of which are herein expressly incorporated by reference.

BACKGROUND AND SUMMARY OF THE INVENTION

The present invention relates to a method and to a device for determining an operating temperature of a battery cell, to an operating method for a battery cell, to a control unit for a battery cell and to a working device, in particular to a vehicle.

When electrical systems are operated on the basis of battery cells, that is to say when battery cells and battery cell modules are used, the operating temperature of a respective battery cell is a parameter which is essential for operation, also with respect to the aspects of efficiency and operational reliability.

A respective operating temperature within a battery cell can be measured directly with considerable expenditure. However, in order to reduce the expenditure, indirect measuring methods are used, on the one hand by using external sensors with respect to a respective battery cell and/or by measuring the impedance of a respective battery cell.

However, the recourse to the impedance of a battery cell entails an energy loss. On the other hand, because an impedance-based temperature determination is highly reliable it is not possible to dispense with it.

The invention is therefore based on the object of specifying a method and a device for determining an operating temperature of a battery cell, an operating method for a battery cell, a control unit for a battery cell and a working device and, in particular, a vehicle, in which the operating temperature of a battery cell can be determined as an operating parameter with a high level of reliability and with the lowest possible energy loss.

According to a first aspect of the present invention, a method for determining an operating temperature of a battery cell, in particular in an electrically operated working device or a vehicle, is provided, in which (i) a value of a measured variable for determining an external temperature of the battery cell is detected close to the battery cell and/or externally with respect thereto, in particular continuously or partially continuously, (ii) an internal temperature of the battery cell is determined by detecting an electrical impedance of the battery cell, and (iii) a value of the operating temperature of the battery cell is determined from the external temperature and/or from the internal temperature. According to the invention, (A) at least in a first operating state of the battery cell the internal temperature of the battery cell is determined less frequently if the value of the ascertained external temperature, of the internal temperature and/or of the operating temperature of the battery cell is in a predefined first safe range. (B) in contrast to this it is determined more frequently if the value of the ascertained external temperature, of the internal temperature and/or of the operating temperature of the battery cell is outside the predefined first safe range.

According to the present invention, one of the determined temperatures, specifically the internal temperature of the battery cell, the external temperature of the battery cell or an operating temperature of the battery cell which is derived therefrom can be placed in a relationship with the predetermined first safe range. It is also conceivable to place a combination of these temperatures in a relationship.

A predefined first safe range can be a closed, open or half-open value interval, a set of discrete values or any desired combination thereof.

The measure of the frequency for the determination of the internal temperature of the battery cell can be configured differently and can be adapted to the respective conditions of the battery cell and/or of an device which is supplied by the battery cell.

Therefore, in one preferred embodiment of the method according to the invention there is provision that the internal temperature of the battery cell is determined less frequently than the external temperature of the battery cell if the value of the ascertained external temperature, of the internal temperature and/or of the operating temperature of the battery cell is within the predefined first safe range.

In one advantageous development of the method according to the invention there is in particular provision that the internal temperature of the battery cell is not determined or does not continue to be determined if the value of the ascertained external temperature, of the internal temperature and/or of the operating temperature of the battery cell is within the predefined first safe range.

According to this measure it is assumed that with respect to the temperature for a battery cell a critical state is not present if a temperature respectively placed in a relationship i.e. the internal temperature, the external temperature and/or the derived operating temperature, are/is within the predefined first safe range.

The detection of a value of a measured variable which is close to a cell and/or external with respect thereto can be implemented in various ways. In one particularly simple embodiment of the present invention, the detection of the value of the measured variable close to the battery cell and/or externally with respect thereto is carried out by means of at least one sensor which is close and/or external with respect to the battery cell, in particular using a temperature sensor. In this context, particularly reliable measurement results are obtained if the sensor which is external with respect to the cell is mounted, for example, on an external wall and/or on a housing of the battery cell which is used as a basis or is in mechanical and/or thermal contact therewith, preferably on a cell connection or on the cell terminal or, in the region of a cell connection or cell terminal, or as a part thereof.

If values of the external temperature of the battery cell are readily used as a basis, in order to control the behavior and the operation of a battery cell, incorrect estimations can occur. As a rule, externally detected values must be subjected to correction. Since it is particularly advantageous if, according to another preferred embodiment of the method according to the invention, in order to determine the external temperature of battery cell the detected value of the measured variable is used in a temperature model for the battery cell. This temperature model is advantageously configured to take into account all the correction mechanisms, for example offsets and/or temporal delays.

Since generally internal temperatures of the battery cell have a higher degree of reliability, and to be precise compared with values based on values of the external temperature of the battery cell, according to another development of the method according to the invention, in order to adapt and/or support the temperature model, if appropriate one or more values of the internal temperature of the battery cell which have been detected by means of the electrical impedance of the battery cell can be used.

The respective first operating state of the battery cell can be a state of rest of the battery cell, a load state of the battery cell or a discharge state of the battery cell, in which energy is extracted from the battery cell, or the battery cell outputs energy.

Alternatively or additionally to this, in a second operating state of the battery cell, which is different from the first operating state of the battery cell, and, in particular, corresponds to a state of charge of the battery cell or a recuperation state of the battery cell, in which energy is fed to the battery cell or the battery cell takes up energy, the frequency of determination of the internal temperature of the battery cell is independent of the status of the ascertained external temperature, of the internal temperature and/or of the operating temperature of the battery cell with respect to the predefined first safe range, and can correspond, in particular, to the frequency of determination of the external temperature of the battery cell.

According to a further aspect of the present invention, an operating method for a battery cell is also provided, in particular in an electrically operating working device or in a vehicle, wherein an operating temperature of the battery cell is determined by means of a method according to the invention for determining an operating temperature of a battery cell, and is used to control the operation of the battery cell.

In one advantageous development of the operating method according to the invention it is tested whether the value of the external temperature of the battery cell, the value of the internal temperature of the battery cell and/or the value of the derived operating temperature of the battery cell are/is outside a predefined second critical range which comprises the predefined first critical range as a first safe range.

According to the invention, in this context an operating state of the battery cell is selected and/or influenced as a function of a result of this testing.

In addition, the present invention also provides a control unit for a battery cell and/or for a working device or a vehicle having a battery cell, which is configured to carry out a method according to the invention for determining an operating temperature of a battery cell and/or according to an operating method for a battery cell.

Furthermore, the subject matter of the present invention is also a device for determining an operating temperature of a battery cell, in particular in an electrically operated working device or a vehicle.

The device according to the invention is embodied with an impedance measuring apparatus which is configured to measure an electrical impedance of the battery cell, a temperature measuring apparatus which is configured to measure an external temperature of the battery cell or a measured value which is representative thereof, and has, for this purpose, in particular a sensor which is close and external with respect to the battery cell or an operative connection to a sensor which is close and external with respect to the battery cell.

Furthermore, a control unit which is designed according to the invention is embodied and is configured to detect measured values of the impedance measuring apparatus and of the temperature measuring apparatus.

Finally, a working device and, in particular, a vehicle are subject matters of the present invention, wherein they are embodied with an electrically drivable assembly and, in particular, with a drive, with a battery cell for supplying the assembly with electrical energy in a controllable fashion, and with a control device for controlling the operation of the assembly and/or of the battery cell which is embodied with a control unit which is designed according to the invention and/or with a device which is designed according to the invention and/or is designed to carry out a method according to the invention for determining an operating temperature of a battery cell and/or an operating method according to the invention for a battery cell.

Further details, features and advantages of the invention can be found in the following description and the figures.

Other objects, advantages and novel features of the present invention will become apparent from the following detailed description of one or more preferred embodiments when considered in conjunction with the accompanying drawings.

BRIEF DESCRIPTION OF THE DRAWINGS

FIGS. 2 and 3 show graphs which explain embodiments of the method according to the invention for determining an operating temperature of a battery cell.

DETAILED DESCRIPTION OF THE DRAWINGS

Exemplary embodiments and the technical background of the invention are described in detail below and with reference to FIGS. 1 to 3. Identical and equivalent as well as identically or equivalently active elements and components are denoted by the same reference symbol. The detailed description of the denoted elements and components is not reproduced every time they occur.

The illustrated features and further properties can be separated from one another in any desired form and combined with one another as desired without departing from the core of the invention.

Figure 1:
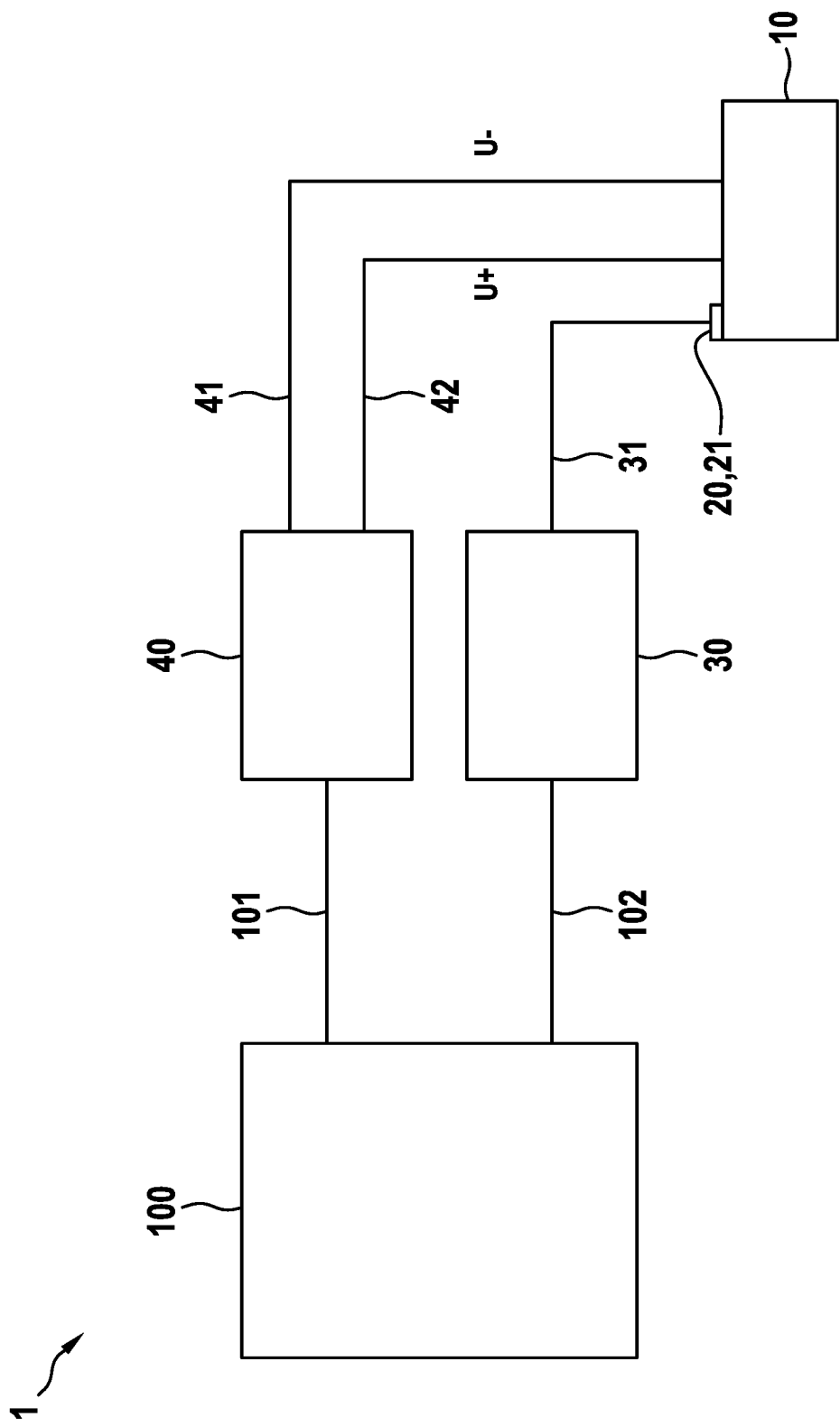
FIG. 1 shows a schematic block diagram of a device according to the invention for determining an operating temperature of a battery cell.

FIG. 1 shows a schematic block diagram of a device 1 according to the invention for determining an operating temperature of a battery cell 10.

The device 1 according to the invention as in FIG. 1 has an impedance measuring apparatus 40 and a temperature measuring apparatus 30.

The temperature measuring apparatus 30 is connected via a detection and control line 31 to a sensor 20, for example a temperature sensor 21, which is arranged outside and therefore externally with respect to the battery cell 10 and adjacently with respect thereto, that is to say downstream of the battery cell 10, for example with attachment of the outer side thereof or to the outer side of a housing of the battery cell 10.

The impedance measuring apparatus 40 is connected to the battery cell 10 via first and second detection and control lines 41 and 42 and is configured to ascertain a direct current impedance or an alternating current impedance of the battery cell 10.

The data which are ascertained with the impedance measuring apparatus 40 and the temperature measuring apparatus 30 are transmitted via first and second control and detection lines 101 and 102 of a control unit 100 to the latter and evaluated by the latter, in order, for example, to ascertain an external temperature of the battery cell 10, an internal temperature of the battery cell 10 and/or an operating temperature of the battery cell 10 and/or the time profiles thereof.

Figure 2:
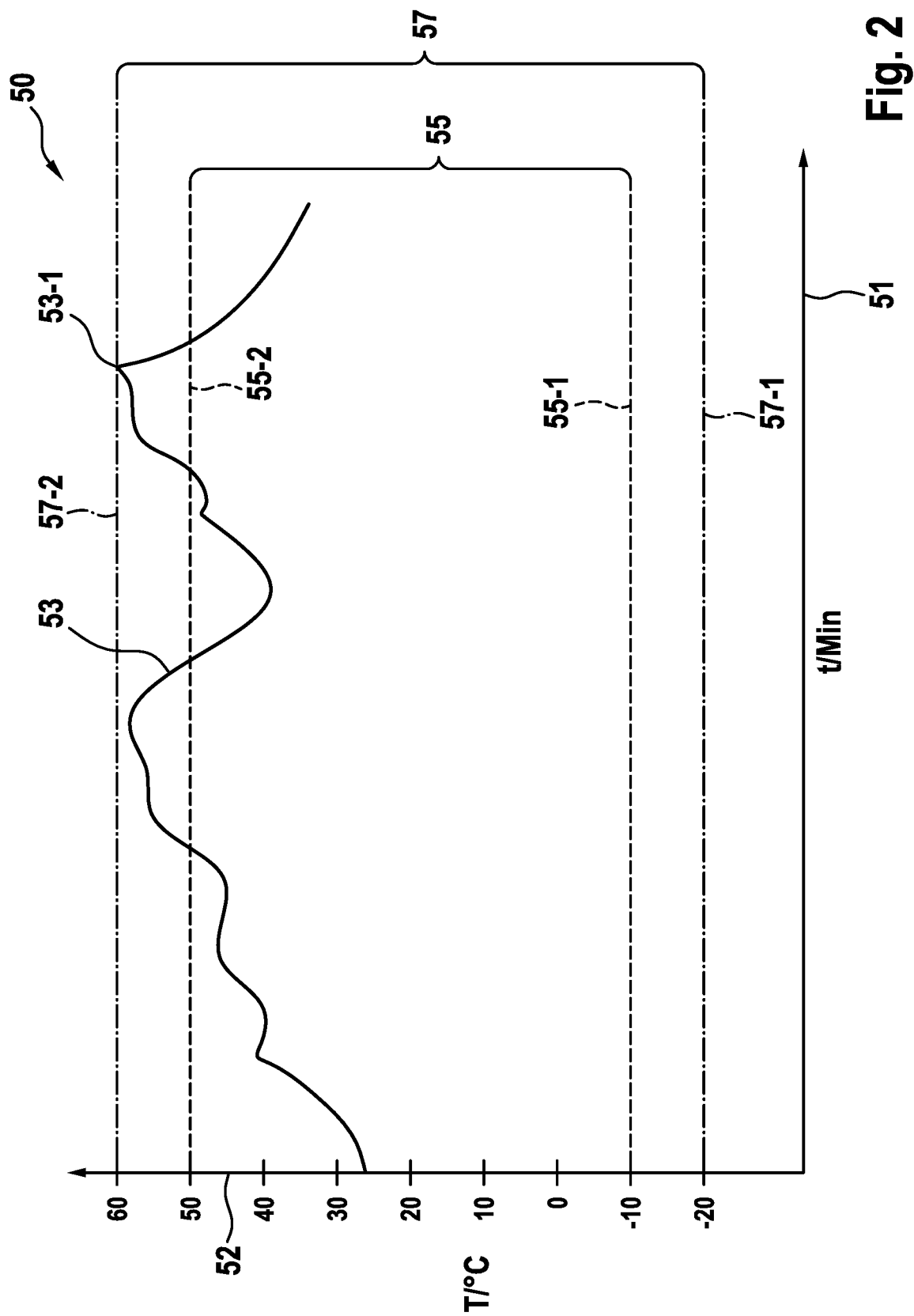

FIGS. 2 and 3 show graphs 50 and 60 which explain embodiments of the method according to the invention for determining an operating temperature of a battery cell 10.

The time is respectively plotted, for example in minutes, on the abscissas 51 and 61, and the temperature in degrees Celsius on the ordinates 52 and 62. The traces 53 and 63 each describe the profile of a temperature as a function of the time, whether this be the internal temperature of the battery cell 10, the external temperature of the battery cell 10 or an operating temperature, derived therefrom, of the battery cell 10.

FIG. 2 illustrates a first predefined safe range 55, here in the form of a temperature interval, between a lower threshold value 55-1 as a lower limit and an upper threshold value 55-2 as an upper limit. Furthermore, a second critical range 57 is marked which completely encloses the first safe range 55 and which is bounded by a lower threshold value 57-1 as a lower limit and an upper threshold value 57-2 as an upper limit in the manner of an interval. If the temperature profile 53 lies within the first safe range 55, according to the invention the determination of the internal temperature of the battery cell 10, which relates to a relatively high energy consumption, by means of the impedance measurement occurs less frequently, to be precise in contrast to times at which the temperature profile 53 is outside the boundaries 55-1 and 55-2 of the first safe range 55. In these cases, the determination of the internal temperature on the basis of the impedance measurement takes place comparatively more frequently. In cases in which the profile 53 of the temperature exceeds the boundaries 57-1 or 57-2 of the second critical range 57 or threatens to exceed them, for example at the point characterized by 53-1, the operation of the battery cell 10 can be changed into a safe mode. The battery cell 10 can, for example, be switched off.

FIG. 3 also shows, in the manner of a graph 60, the profile 63 of the temperature in conjunction with a battery cell 10, for example the external temperature, the internal temperature or an operating temperature, derived therefrom, of the battery cell 10. A lower degradation threshold 71 for a temperature which is determined from the impedance, a lower degradation threshold 72 for the temperature which has been ascertained by means of an external sensor 20, 21, an upper degradation threshold 73 for the temperature from an impedance measurement, an upper degradation threshold 74 for an externally ascertained temperature, a safety threshold 75 for a temperature which is determined by means of impedance measurement, and a safety threshold 76 for a temperature which is ascertained externally by means of a sensor 20 are illustrated here as thresholds or limits. The phases a to k, which are also indicated in the graph 60, are explained in detail below.

These and further features and properties of the present invention are explained further with reference to the following statements:

The internal temperature of a battery cell 10 is ascertained as an external temperature value often by means of external sensors 20, 21.

In this context, a temporal delay inevitably occurs and a certain reserve must be provided because a temperature difference can occur between the decisive temperature of an electrode winding or stack and the external measuring point.

Under such circumstances, methods are applied which are used to determine an internal temperature of a battery cell 10 from the impedance.

The temperature determination by means of an impedance measurement is possible, but results in increased energy consumption.

If the excitation energy is extracted directly from the battery cell 10—for example with excitation via a balancing resistor—the battery cell 10 is continuously discharged. In the case of active excitation by an inverter, at least dissipative losses occur via the cell internal resistance.

Depending on the excitation method, single-digit percentage range reductions can occur owing to the losses.

According to the invention, various operating ranges are provided during operation of a battery cell 10 and during the determination of the temperature:

If an externally ascertained temperature lies in an internal and/or relatively narrow band or value range, measurement of the internal cell temperature by means of the impedance can be refrained from or the impedance can be determined with a low measuring rate—e.g. 0.02 Hz.

The temperature which is determined from the impedance is then used to support a temperature model.

If the externally ascertained temperature exits the internal band 55 or the internal and/or relatively narrow value range 55, the cell temperature is determined from the impedance with a frequency which is predefined from a safety concept.

As a result, the release of power in this temperature range can be ensured.

In the stationary operating mode—e.g. at a charging pole—permanent determination of the temperature by means of the impedance is always possible.

Advantages which are obtained are relatively low energy consumption and therefore a greater range, and to be precise these advantages are unchanged while the advantages of temperature measurement by means of the cell impedance are maintained.

Further additional or alternative aspects of the present invention are also obtained in conjunction with the following explanations:

By virtue of the impedance measurement or modified methods it is possible to determine the average internal cell temperature or temperature of a battery cell 10.

The temperature values which are obtained in this way model the actual internal temperature more precisely and more quickly than temperature values which are detected by means of an external sensor 20, 21.

The internal temperatures of the cells firstly have to be predicted by means of models from temperatures which are detected by means of external sensors.

As a result, deactivation limits or degradation thresholds for temperature values from an external sensor system have to be configured much more tightly than for the ascertained temperature from the impedance (internal temperature value).

Energy is consumed by the impedance measurement.

The measurement is used by an external sensor 20, 21 or alternatively or additionally the impedance measurement is carried out as a function of the ascertained temperature.

The phases a to k which are illustrated in FIG. 3 have the following meaning, wherein TEIS ascertains the temperature determination from the impedance, and Text denote the temperature ascertained with an external sensor.

(a) TEIS is active, current must be degraded.

(b) TEIS is active, and current is no longer degraded and when Text is used ought to be degraded.

(c) Only a measurement of Text, since the temperature in the profile 63 lies between all the degradation thresholds and safety limits, which is equivalent to a normal operation and the most frequent operating point for the mission profile.

(d) The degradation threshold for Text is exceeded, and there is a change to TEIS, and therefore degradation is not necessary.

(e) The degradation threshold is exceeded by TEIS, and therefore degradation of the current is necessary.

The safety limit for Text is exceeded, since it is still possible to use TEIS operation.

(g) The safety limit of Text is complied with again, and TEIS is used, and therefore current degradation continues to be carried out.

(h) The degradation limit of TEIS is complied with again, and no current degradation is necessary; when Text is used the power would be limited.

(i) All the degradation limits are complied with and the measurement takes place again via Text.

(j) The degradation limit for Text is reached again, and switching over to TEIS occurs, as a result no degradation is necessary.

In the preceding example, in conjunction with FIG. 3 a continuous measurement is assumed—e.g. with a measuring frequency of 1 Hz—of the respective sensor 20, 21 and/or of the determination method.

In the phases in which only measurement by means of Text would be necessary, e.g. in the phases (c), (i), (k), the temperature measurement can be supported by means of TEIS in short intervals.

This could look, for example, like this:

Continuous measurement of Text occurs in the phases (c), (i), and (k) with support by TEIS every 5 minutes.

The temperature model is corrected by means of a value from TEIS, and variants of the Kalman filter are also conceivable.

LIST OF REFERENCE NUMBERS

1 Device, measuring device, measuring arrangement
10 Battery cell
20 Sensor
21 Temperature sensor
30 Temperature measuring apparatus
31 Detection and control line
40 Impedance measuring apparatus
41 (First) detection and control line
42 (Second) detection and control line
50 Graph
51 Abscissa
52 Ordinate
53 Trace, temperature
53-1 Exceeding/maximum value of the trace 53
55 (First) safe range
55-1 Lower limit
55-2 Upper limit
57 (Second) critical range
57-1 Lower limit
57-2 Upper limit
60 Graph
61 Abscissa
62 Ordinate
63 Trace, temperature
71 Lower degradation threshold for temperature from impedance
72 Lower degradation threshold for temperature from external sensor 20
73 Upper degradation threshold for temperature from impedance
74 Upper degradation threshold for temperature from external sensor 20
75 Safety threshold for temperature from impedance
76 Safety threshold for temperature from external sensor 20
100 Control unit The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for determining an operating temperature of a battery cell, the method comprising:
   determining an external temperature of the battery cell;
   determining an internal temperature of the battery cell via detecting an electrical impedance of the battery cell; and
   determining an operating temperature of the battery cell from at least one of: the external temperature and the internal temperature,
   wherein, in a first operating state of the battery cell the internal temperature of the battery cell is determined:
   at a first frequency, if a temperature profile of the battery cell is in a predefined first safe range, and
   at a second frequency greater than the first frequency, if the temperature profile is outside the predefined first safe range, and
   wherein the temperature profile reflects at least one of: the external temperature, the internal temperature and the operating temperature, of the battery cell.

2. The method according to claim 1, wherein the internal temperature of the battery cell is determined less frequently than the external temperature of the battery cell if the value of the determined external temperature, the internal temperature and/or the operating temperature of the battery cell the external temperature is determined at a third frequency greater than the first frequency, if the temperature profile is within the predefined first safe range.

3. The method according to claim 1, wherein the first frequency is zero.

4. The method according to claim 2, wherein the first frequency is zero.

5. The method according to claim 1, wherein the external temperature is determined via a temperature sensor.

6. The method according to claim 2, wherein the external temperature is determined via a temperature sensor.

7. The method according to claim 3, wherein the external temperature is determined via a temperature sensor.

8. The method according to claim 1, wherein the external temperature is determined via a temperature model for the battery cell.

9. The method according to claim 2, wherein the external temperature is determined via a temperature model for the battery cell.

10. The method according to claim 3, wherein the external temperature is determined via a temperature model for the battery cell.

11. The method according to claim 8, further comprising adapting and/or supporting the temperature model based on the internal temperature.

12. The method according to claim 9, further comprising adapting and/or supporting the temperature model based on the internal temperature.

13. The method according to claim 10, further comprising adapting and/or supporting the temperature model based on the internal temperature.

14. The method according to claim 1, wherein at least one of:
the first operating state is a rest state, a load state or a discharge state, and
the predefined first safe range is defined by at least one of: a temperature lower limit and a temperature upper limit, between −10° C. to +50° C.

15. The method according to claim 14, wherein in a second operating state of the battery cell, which is a charging state or a recuperation state:
the internal temperature is determined at a fourth frequency, independent of whether the temperature profile is in the predefined safe range, and
the external temperature is determined at the fourth frequency.

16. A device configured to determine an operating temperature of a battery cell, the device comprising:
an impedance measuring apparatus configured to measure an electrical impedance of the battery cell;
a temperature sensor configured to measure a measured temperature exterior and adjacent to the battery cell; and
a control unit configured to:
determine an external temperature of the battery cell from the measured temperature,
determine an internal temperature of the battery cell by detecting the electrical impedance of the battery cell, and
determine an operating temperature of the battery cell from at least one of: the external temperature and the internal temperature,
wherein, in a first operating state of the battery cell, the internal temperature of the battery cell is determined:
at a first frequency, if a temperature profile of the battery cell is in a predefined first safe range, and
at a second frequency greater than the first frequency, if the temperature profile of the battery cell is outside the predefined first safe range, and
wherein the temperature profile reflects at least one of: the external temperature, the internal temperature and the operating temperature, of the battery cell.

17. A vehicle comprising:
an electrically drivable assembly;
a battery cell configured to supply the assembly with electrical energy in a controllable fashion; and
a control device configured to control the operation of the assembly and/or of the battery cell, the control device being configured to:
detect a value of a measured variable for determining an external temperature of the battery cell,
determine an internal temperature of the battery cell by detecting an electrical impedance of the battery cell, and
determine a value of an operating temperature of the battery cell from the external temperature and/or from the internal temperature,
wherein at least in a first operating state of the battery cell the internal temperature of the battery cell
is determined less frequently if the value of the determined external temperature, the internal temperature and/or the operating temperature of the battery cell is in a predefined first safe range, and
is determined more frequently if the value of the determined external temperature, the internal temperature and/or the operating temperature of the battery cell is outside the predefined first safe range.

* * * * *